United States Patent
Bauer et al.

(10) Patent No.: US 8,013,441 B2
(45) Date of Patent: Sep. 6, 2011

(54) POWER SEMICONDUCTOR DEVICE IN LEAD FRAME EMPLOYING CONNECTING ELEMENT WITH CONDUCTIVE FILM

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 283 days.

(21) Appl. No.: 11/581,678

(22) Filed: Oct. 16, 2006

(65) Prior Publication Data

US 2007/0085201 A1    Apr. 19, 2007

(30) Foreign Application Priority Data

Oct. 14, 2005   (DE) .......................... 10 2005 049 687

(51) Int. Cl.
| | |
|---|---|
| H01L 23/48 | (2006.01) |
| H01L 23/58 | (2006.01) |
| H01L 23/62 | (2006.01) |
| H01L 23/495 | (2006.01) |
| H01L 23/52 | (2006.01) |
| H01L 29/40 | (2006.01) |

(52) U.S. Cl. ........ 257/735; 257/736; 257/750; 257/762; 257/666; 257/665; 257/676; 257/741; 257/E23.013; 257/E23.012

(58) Field of Classification Search .................. 257/666, 257/690, 731, 730, 693, 682, 676, 678, 673, 257/735, 736, 773, 753, 750, 762, 665, 741, 257/E23.013, E23.012
See application file for complete search history.

(56) References Cited

U.S. PATENT DOCUMENTS

| 4,766,479 | A | 8/1988 | Krum et al. |
| 6,040,626 | A | 3/2000 | Cheah et al. |
| 6,410,363 | B1 * | 6/2002 | Tani et al. ..................... 438/112 |
| 6,459,147 | B1 | 10/2002 | Crowley et al. |
| 6,747,360 | B2 * | 6/2004 | Fukuizumi et al. ........... 257/783 |
| 6,774,466 | B1 * | 8/2004 | Kajiwara et al. .............. 257/673 |
| 6,798,046 | B1 * | 9/2004 | Miks ............................. 257/666 |
| 6,841,421 | B2 | 1/2005 | Aono et al. |
| 6,919,644 | B2 * | 7/2005 | Uchida .......................... 257/784 |
| 7,432,594 | B2 * | 10/2008 | Ashida et al. ................. 257/735 |
| 2002/0000571 | A1 * | 1/2002 | Chen et al. .................... 257/192 |

(Continued)

FOREIGN PATENT DOCUMENTS

DE          103 28 265          1/2005

(Continued)

*Primary Examiner* — Phat X Cao
*Assistant Examiner* — Diana C Garrity
(74) *Attorney, Agent, or Firm* — Dicke, Billig & Czaja, PLLC

(57) ABSTRACT

One aspect of the invention relates to a power semiconductor device in lead frame technology and a method for producing the same. The power semiconductor device has a vertical current path through a power semiconductor chip. The power semiconductor chip has at least one large-area electrode on its top side and a large-area electrode on its rear side. The rear side electrode is surface-mounted on a lead frame chip island of a lead frame and the top side electrode is electrically connected to an internal lead of the lead frame via a connecting element. The connecting element has an electrically conductive film on a surface facing the top side electrode, the electrically conductive film extending from the top side electrode to the internal lead.

20 Claims, 3 Drawing Sheets

U.S. PATENT DOCUMENTS

| | | | |
|---|---|---|---|
| 2003/0062608 A1* | 4/2003 | Hamachi | 257/676 |
| 2003/0162330 A1 | 8/2003 | Aono et al. | |
| 2004/0246692 A1* | 12/2004 | Satoh et al. | 361/782 |
| 2005/0048758 A1* | 3/2005 | Hosseini et al. | 438/614 |
| 2005/0121806 A1* | 6/2005 | Sangiorgi | 257/787 |
| 2005/0127532 A1 | 6/2005 | Luo et al. | |
| 2005/0133808 A1* | 6/2005 | Uraya et al. | 257/99 |

FOREIGN PATENT DOCUMENTS

| | | |
|---|---|---|
| DE | 10 2004 036905 | 3/2006 |
| DE | 102005039165 | 3/2007 |
| WO | 2006012847 | 2/2006 |

* cited by examiner

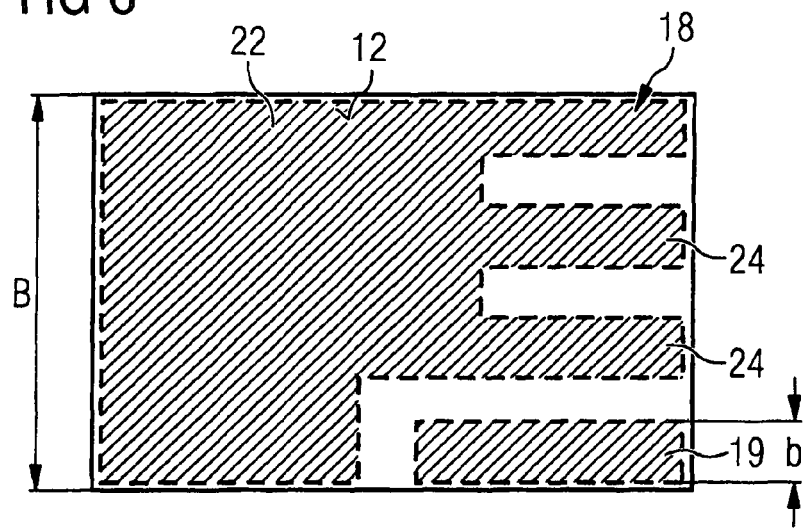
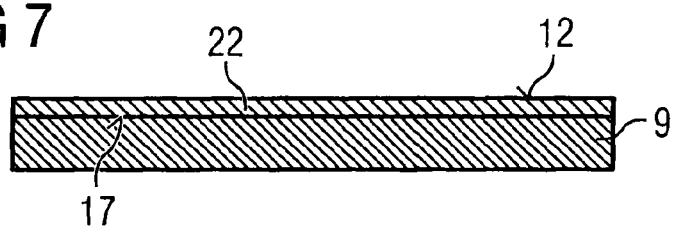
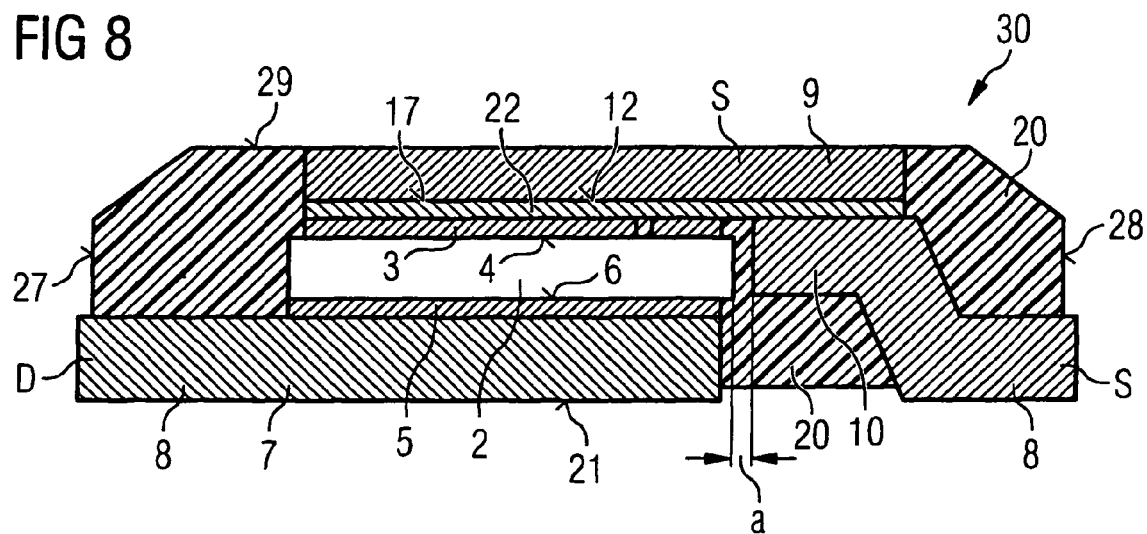

POWER SEMICONDUCTOR DEVICE IN LEAD FRAME EMPLOYING CONNECTING ELEMENT WITH CONDUCTIVE FILM

CROSS REFERENCE TO RELATED APPLICATIONS

This Utility Patent Application claims priority to German Patent Application No. DE 10 2005 049 687.3, filed on Oct. 14, 2005, which is incorporated herein by reference.

BACKGROUND

One power semiconductor device is known from the document US 2003/0162330 A1. In the case of the known power semiconductor device including a power semiconductor chip, however, there is no large-area electrode provided on the top side of the power semiconductor chip, rather said large-area electrode is divided into contact strips. The contact strips of the surface electrode are connected via bonding wires to a busbar, which, for its part, is arranged on an insulated base and merges into a lead frame. The large-area rear side electrode is fixed directly on a chip island of a lead frame and is electrically connected to an external lead.

One disadvantage of this power semiconductor device is that the surface electrode is divided into narrow strips, which, for their part, merge into bonding wires. This has the disadvantage that the permissible current loading is limited by the sum of the cross sections of the bonding wires. Consequently, the current has to be limited depending on the diameters of the bonding wires in order to prevent the bonding wires of the power semiconductor device from being melted through.

The document DE 104 23 648 discloses a sensor device including a freely accessible sensor region, the sensor region of which is connected to corresponding contact pads on a substrate via connecting lines, in which case these connecting lines may be either bonding tapes, bonding wires or flat cables.

In order to apply this solution to a power semiconductor device, the cross sections of the bonding tapes have to be increased in such a way that a reliable bonding connection cannot be ensured on account of the thickness then required for the bonding tapes.

If a plurality of bonding wires are used for the power semiconductor device, these limit the maximum possible current or the maximum possible current loading through the power semiconductor device, as is already known from the document US 2003/01623301 A1. Finally, there are also solutions in which flat cables connect the large-area electrode to corresponding wide contact pads of an internal lead. However, these relatively flat cables also exhibit the problem of producing a reliable, cohesive connection to the large-area top side electrode.

SUMMARY

One aspect of the invention relates to a power semiconductor device in lead frame technology with a vertical current path through a power semiconductor chip, the power semiconductor chip having at least one large-area electrode on its top side and a large-area electrode on its rear side. In this case, the vertical current path is formed between the rear side electrode and the top side electrode. In the case of the lead frame technology, the rear side electrode of the power semiconductor chip is surface-mounted on a lead frame chip island of a lead frame. The top side electrode is electrically connected to at least one internal lead of the lead frame via a connecting line or a connecting element, also called "clip".

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 6 illustrates a schematic bottom view of a patterned electrically conductive film of a connecting element for the power semiconductor device in accordance with FIG. 5.

FIG. 7 illustrates a schematic cross section through the connecting element with an electrically conductive film.

FIG. 8 illustrates a schematic cross section through the power semiconductor device in accordance with FIG. 5.

DETAILED DESCRIPTION

Figure 1:
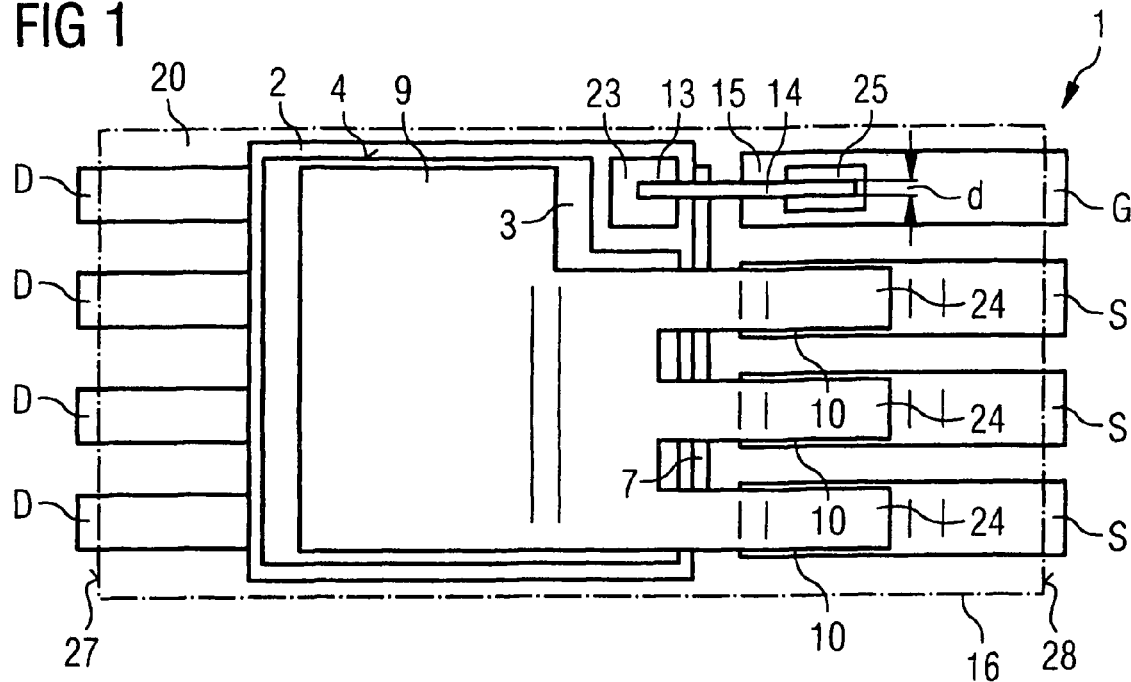
FIG. 1 illustrates a schematic plan view of a power semiconductor device of a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One aspect of the invention provides a power semiconductor device in lead frame technology with a vertical current path through a power semiconductor chip, the power semiconductor chip having at least one large-area electrode on its top side and a large-area electrode on its rear side, and the vertical current path being formed between the rear side electrode and the top side electrode, and a higher current density can be permitted. Furthermore, some embodiments of the invention overcome the disadvantages in the prior art and to specify a connecting element which without risk also permits high-power currents from a large-area top side electrode to at least one corresponding contact pad on an internal lead.

One aspect of the invention provides a power semiconductor device in lead frame technology with a vertical current path through a power semiconductor chip. For this purpose, the power semiconductor chip has at least one large-area electrode on its top side and a large-area electrode on its rear side. A vertical current path is formed between the rear side electrode and the top side electrode during the operation of the power semiconductor device. For this purpose, the rear side electrode is surface-mounted on a lead frame chip island and the top side electrode is connected to an internal lead of a lead frame via a connecting element. Said connecting element has an electrically conductive film on a surface facing the top side electrode, the electrically conductive film extending from the top side electrode to the internal lead.

With this power semiconductor device, the current conductivity is not limited by the cross section of bonding wires, nor is it limited by the cross section of a connecting element, but rather is improved by a connecting element having an electrically conductive film on a surface facing the top side electrode, the electrically conductive film extending from the top side electrode to the internal lead and increasing the current conductivity of the connecting element on account of high current conductivity. While the connecting element, as a dimensionally stable self-supporting device component, may have a material having low current conductivity, in order to increase the mechanical stability of the power semiconductor device by means of an iron-chromium-nickel alloy, for example, the electrically conductive film may have metal particles having high specific electrical conductivity.

The high current conductivity is made available by the electrically conductive film. Since the electrically conductive film is arranged between the connecting element and the top side electrode or the internal lead, the operating current is primarily conducted via the electrically conductive film with high current conductivity, without the interposition of a less readily conductive material of the mechanical connecting element in the form of a "clip". The power semiconductor device can be loaded with significantly higher current peaks than the previously known power semiconductor devices with the same or similar technology and known "clips" or chip materials.

In one embodiment of the invention, the electrically conductive film is cohesively connected to the connecting element. The electrically conductive film thereby attains the stability of the connecting element and can itself be used for the function of a "clip" in a power semiconductor device by virtue of the cohesive connection to the connecting element. Since the connecting element itself is usually produced from a metal or a metal plate, it can contribute to carrying current, so that it is advantageous for the electrical connection of the top side electrode to at least one internal lead if the cohesive connection is ensured by an electrically conductive adhesive or by a soldering layer.

In one embodiment of the invention, the electrically conductive film has a plastic material highly filled with silver particles. In this case, the degree of filler preferably lies between 92% by volume and 98% by volume. Since silver has the highest specific conductivity of metals, the electrical conductivity of the overall composite comprising electrically conductive silver particles and the material of the connecting element will have a low conduction resistance that has not been achieved heretofore.

The film material may also have a metal having a higher conductivity than the mechanically stabilizing connecting element. If the connecting element includes an iron-nickel-chromium compound, for example, the electrically conductive film has a gold film or a gold alloy film. This has two advantages, one being that gold has a higher specific conductivity than sheet-metal or steel plates. In addition, gold has the property that the contact transition resistance is extremely low with respect to other metal surfaces, and, finally, gold is a metal which does not oxidize and retains its outstanding contact properties over a long period. Finally, gold and gold alloys have the properties of forming a eutectic compound having a low melting point with a top side electrode made of aluminum, for example, thereby enabling an intimate connection of a surface electrode of the power semiconductor chip made of aluminum.

In a further embodiment of the invention, the electrically conductive film has a silver film or a silver alloy film. As is known, silver is a metal having the highest specific electrical conductivity. A silver film thus fulfils the best prerequisites for improving the electrical connecting properties of a metallic "clip" having poorer electrical conductivity. Moreover, silver together with other metals can form silver solder, which can be connected cohesively at low temperatures, for example to the top side electrode of the power semiconductor chip. The same also applies, of course, to the contact pad on the internal lead to which the electrically conductive film extends.

In order to effect geometrically an exact connection between the large-area top side electrode of the power semiconductor chip and the patterned contact pad of an internal lead, in a further embodiment of the invention, the electrically conductive film has an areal structure adapted to that of the internal lead and to the areal structure of the top side electrode. The internal lead in power semiconductor devices of this type is often divided into a plurality of individual internal leads which are electrically connected to corresponding external leads. In this case, the areal structure of the electrically conductive film has electrically conductive strips which bridge the distance between the top side electrode of the power semiconductor chip and the internal leads and at the same time enable contact-connection to corresponding contact pads on the internal leads.

In a further embodiment of the invention, an electrically conductive joining layer is arranged between the top side electrode and the electrically conductive film. The same also applies to the contact pads of the at least one internal lead and the electrically conductive film. Said electrically conductive joining layer may be achieved by a diffusion solder layer, by an alloy solder layer and/or, as already mentioned above, by an electrically conductive adhesive layer.

In the case of the electrically conductive adhesive layer, a layer of a conductive adhesive is arranged between the top side electrode and the electrically conductive film. Conductive adhesives of this type have metal particles made of silver or silver alloys with good electrical conductivity, so that they are compatible with a silver film, for example, and thus also develop outstanding contact properties.

In a further embodiment of the invention, it is provided that the power semiconductor chip has a control electrode on its top side, said control electrode being electrically connected to a further internal lead via a bonding wire. Control electrodes of this type carry only a low switching current, which is extremely minimal compared with the actual current path, so that a simple bonding wire connection suffices to provide a sufficient current-carrying capacity for the control signals. On the other hand, bonding wire techniques require a further production step in the production method for such power semiconductor devices, which can indeed make the manufacturing process more expensive.

Consequently, in a further embodiment of the invention, such a bonding wire is avoided by virtue of the electrically conductive film having structures which are insulated from one another but which are arranged on the connecting element, so that both the connection between control electrode and further internal lead and the connection between large-area top side electrode and the large-area internal lead can be performed by means of a single connection or joining step.

This requires the existence of an insulation layer between connecting element and electrically conductive film at least in the region of an electrically conductive strip of the electrically conductive film. Consequently, the connecting element for the connection of the control electrode to a further internal lead serves merely as a mechanical support or mechanical bridge, while the connecting element for the electrical connection between top side electrode of the power semiconductor chip and large-area internal lead can indeed contribute to carrying current in that the electrically conductive film has no insulation layer toward the connecting element in this region.

Although the preparation of a film of this type requires greater care because partial regions of the electrically conductive film are electrically connected to the connecting element and other partial regions as are required for the control electrode are to be insulated from the connecting element, structures of this type can nevertheless be introduced with low costs for an electrically conductive film, which are lower than the costs for a separate bonding step for fitting a bonding wire.

The connecting elements according to one embodiment of the invention with an electrically conductive film are preferably used for power semiconductor devices which are known by the collective term compensation power semiconductor devices, such as power semiconductor diodes having a cathode as rear side electrode and an anode as top side electrode or a so-called "Cool MOS" having a large-area drain electrode on its rear side and a large-area source electrode on its top side, between which the current path is formed as soon as a corresponding potential is applied to the relatively small-area gate electrode located on the top side. Furthermore, power semiconductor devices such as IGBT devices or PN$^-$N$^+$ diodes can be equipped with the connecting elements according to the invention with an electrically conductive film, on the one hand the on-state resistance being reduced and the mechanical stability being increased, and on the other hand the risk of overheating of the connecting elements being reduced.

A method for producing a plurality of power semiconductor devices in lead frame technology with a vertical current path through a power semiconductor chip has the following method steps. The first step involves producing power semiconductor chips having at least one large-area top side electrode and at least one large-area rear side electrode, the areal extent of the rear side electrode corresponding to the size of the rear side itself. Furthermore, provision is made of lead frame having a lead frame chip island and at least one internal lead at a distance from the lead frame chip island in a plurality of power semiconductor device positions of the lead frame. The power semiconductor chips are applied in the power semiconductor device positions of the lead frame while cohesively connecting the rear side electrodes to the lead frame chip islands of the lead frame.

In order to connect the top side electrode to the at least one lead, firstly a cohesive connection of an electrically conductive film to a connecting element is carried out, the areal structure of the connecting element being adapted to the top side electrode and the internal lead in the power semiconductor device positions. Afterward, the connecting element with electrically conductive film that has been prepared in this way is applied to the top side electrode and the at least one internal lead of the lead frame. After this application, the power semiconductor chip with the connecting elements can then be packaged in a plastic housing composition in the power semiconductor device positions. This is followed by separation of the lead frame into individual power semiconductor devices.

An exemplary method of this type has the following features.

1. As a result of the preparatory joining together, also called "preassembly", of the electrically conductive film, also called "tape", onto the rear side of the connecting element or "clip", a laminate is produced which can be used as connecting element.

2. In addition, a better process reliability is achieved, especially as the connection with the aid of the improved connecting element is more rigid in comparison with adhesive bonding and soldering, and the "clip" can be positioned better as a result.

3. A further advantage resides in the low process temperature, which is lower than during soldering and nevertheless does not bring about melting of the connection upon reaching a temperature of 260 degrees, which occurs when power semiconductor devices of this type are soldered onto a superordinate circuit board.

4. The risk of contamination such as may occur due to soldering pastes, for example, is reduced in the case of the connecting process according to the invention.

5. Furthermore, a more reliable contact-connection between the top side contact and a connecting element is achieved via the electrically conductive film, since no "adhesive bleed" and "solder splash" arise.

6. As a result of patterning the electrically conductive film by the provision of regions having high and very low conductivity by means of, for example, targeted distribution of silver particles in a film or by strip formation of silver plating films or gold plating films, the film can also be used as rewiring for the control electrode mentioned above, so that it is possible to completely dispense with a wire bonding process in a power semiconductor device. For this purpose, preferably the power semiconductor chip will have a control electrode on its top side, said control electrode being connected to a further internal lead via an electrically conductive film strip—arranged in insulated fashion—of the electrically conductive film of the connecting element.

FIG. 1 illustrates a schematic plan view of a power semiconductor device 1 of a first embodiment of the invention. In order to illustrate the construction of the power semiconductor device 1, the plastic housing composition 20 is merely identified by a dash-dotted line 16. Plastic housing compositions 20 of this type are customarily not transparent and not translucent. Moreover, they are filled with ceramic filler particles for reducing the coefficient of expansion.

This plan view illustrates a connecting element 9 arranged on a top side electrode 3 of a power semiconductor chip 2. Said connecting element 9 has finger-shaped strips 24 extending from the large-area top side electrode 3 and the region of the connecting element 9 that is adapted thereto to three internal leads 10, the finger-shaped strips 24 of the connecting element 9 being electrically connected to the internal leads 10. Said internal leads 10 merge into three external source leads S.

A small-area electrode 23 having a control electrode 13 is arranged on the top side 4 of the power semiconductor chip 2 alongside the large-area top side electrode 3, which in this case is a source electrode, the control electrode 13 being electrically connected on a contact pad 25 of a further internal lead 15 via a bonding wire 14 having a diameter d. In this case, said internal lead 15 merges into a external gate lead G. In order to ensure a low contact transition resistance from the connecting element 9 to the internal leads 10, the connecting element 9 has an electrically conductive film 11, which is illustrated in FIG. 2, on its surface 17 facing the surface electrode 3.

Figure 2:
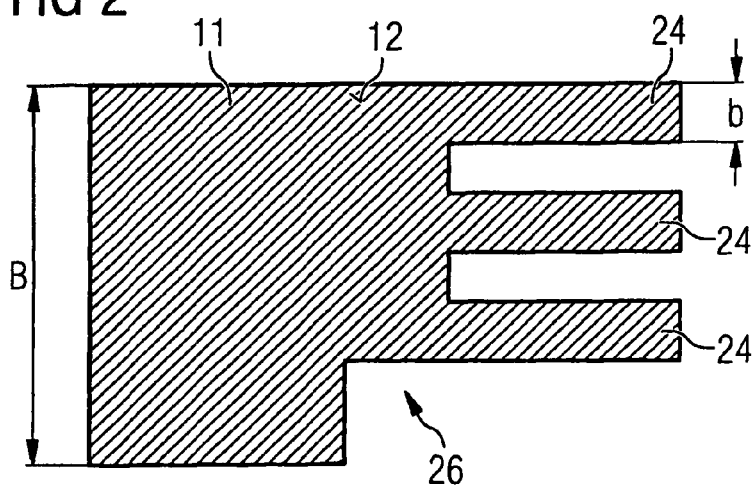
FIG. 2 illustrates a schematic bottom view of an electrically conductive film of a connecting element for the power semiconductor device in accordance with FIG. 1.

FIG. 2 illustrates a schematic bottom view of an electrically conductive film 11 of a connecting element 9 for the power semiconductor device 1 in accordance with FIG. 1. In this first embodiment of the invention, said electrical connecting film 11 is produced from a plastic filled with silver particles. In this case, the degree of filler is between 92% by volume <f<98% by volume. What is achieved by virtue of this high degree of filler is that the electrically conductive film 11 has a high electrical conductivity. The width b in the region of the large-area top side electrode 3 is adapted in terms of its areal extent to the source electrode of the power semiconductor chip, while the finger-shaped strips 24 of the electrically conductive film 11 are adapted in terms of their width b to the width of the internal leads. Moreover, the structure of the electrically conductive film 11 has a cutout 26, in which the small-area control electrode 13 is arranged on the top side 4 of the power semiconductor device 2.

Figure 3:
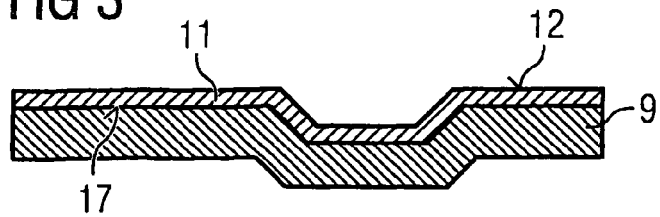
FIG. 3 illustrates a schematic cross section through the connecting element with an electrically conductive film in accordance with FIG. 2.

FIG. 3 illustrates a schematic cross section through the connecting element 9 with an electrically conductive film 11 in accordance with FIG. 2.

In this respect, the electrically conductive film 11 is arranged cohesively on the surface 17 of the connecting element 9 and has a top side 12, which, on the one hand, can be applied to the top side electrode 3 and, on the other hand, can be positioned on the internal leads 10. The connecting element 9 is slightly curved in between in order to bridge the distance between the internal leads 10 and the power semiconductor chip 2.

Figure 4:
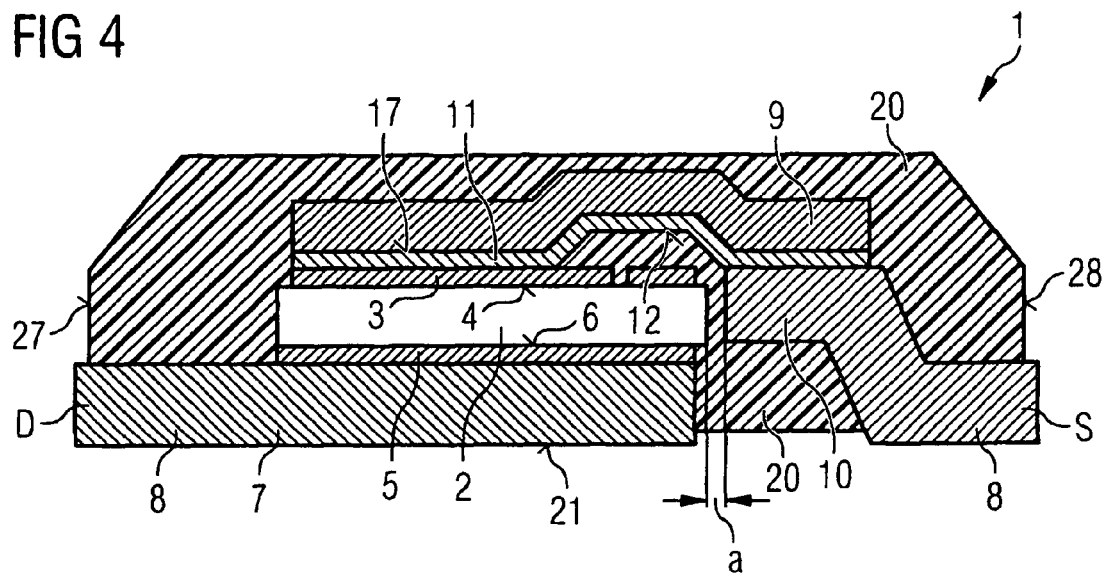
FIG. 4 illustrates a schematic cross section through the power semiconductor device in accordance with FIG. 1.

FIG. 4 illustrates a schematic cross section through the power semiconductor device 1 in accordance with FIG. 1. This cross section now illustrates how the connecting element 9 is cohesively applied as a "clip" to the top side 4 or the top side electrode 3 of the power semiconductor chip 2 and is simultaneously fixed on the internal lead 10 with the electrically conductive film 11. In this case, the distance a between internal lead 10 and power semiconductor chip 2 is bridged by the connecting element 9.

The electrically conductive film 11 accepts the main current loading in the case of this bridging since its current conductivity is greater than the current conductivity of the material of the connecting element 9. For this purpose, a gold film, or a silver film, may be plated onto the surface 17 of the connecting element 9, the silver film having the highest specific electrical conductivity of the metals. The individual components such as the external drain contact D on the underside 21 of the power semiconductor device 1, the external source lead S, the power semiconductor chip 2, the connecting element 9 and the electrically conductive film 11 are packaged in a plastic housing composition 20, which protects the power semiconductor device 1 from damage.

In this case, the external source lead S and the external drain contacts D and the external gate lead (not illustrated here) project from the plastic housing composition 20 on the underside 21 of the power semiconductor device housing. It is also possible to contact-connect the external leads at the edge sides 27 and 28 of the power semiconductor device 1.

Figure 5:
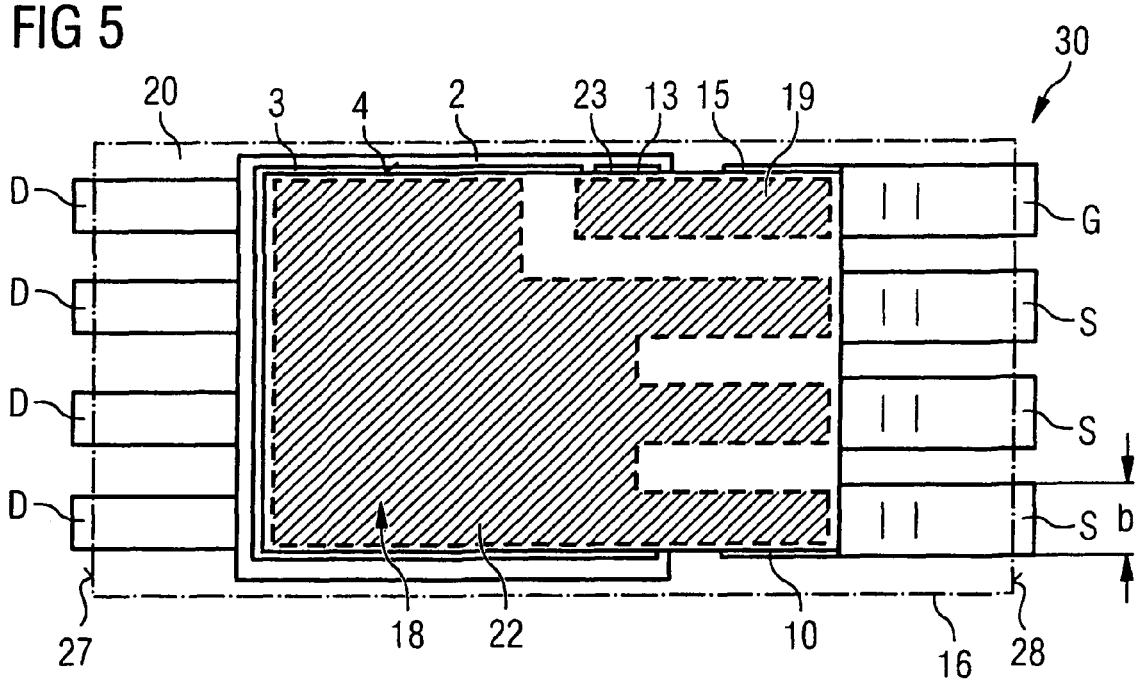
FIG. 5 illustrates a schematic plan view of a power semiconductor device of a second embodiment of the invention.

FIG. 5 illustrates a schematic plan view of a power semiconductor device 30 of a second embodiment of the invention. Components having functions identical to those in the previous figures are identified by the same reference symbols and are not discussed separately.

In FIG. 5, not only has the plastic housing composition been omitted and identified by a dash-dotted line 16, but also the connecting element is initially not illustrated, rather only an electrically conductive patterned film 22 is illustrated, which electrically connects the large-area top side electrode 3 of the power semiconductor chip 2 to corresponding internal leads 10.

For this purpose, the electrically conductive film 22 has regions which are electrically conductive due to a high filling of silver particles, and other regions which are insulating on account of not being filled with electrically conductive particles. As a result, it is possible to provide a patterned electrically conductive film 22 which not only electrically connects the large-area top side electrode 3 to the internal leads 10 but, in a manner insulated therefrom, can electrically connect the small-area electrode 23 of the control electrode 13 of the power semiconductor device 30 to a further internal lead 15, without short circuits occurring between the electrically conductive film strip 19 for the small-area electrode 23 and the finger-shaped strips 24 for the large-area electrode 3.

FIG. 6 illustrates a schematic bottom view of a patterned electrically conductive film 22 of a connecting element 9 for the power semiconductor device 30 in accordance with FIG. 5. Here, too, it becomes clear that this patterned electrically conductive film 22 does not require a cutout for the so-called gate terminal, but rather has an electrically conductive film strip 19 having the width b which, instead of a bonding wire as is illustrated in the first embodiment of the invention, can now connect the small-area electrode 23 to a corresponding external gate lead G as is illustrated in FIG. 5.

FIG. 7 illustrates a schematic cross section through the connecting element 9 with a patterned electrically conductive film 22. The difference with respect to the connecting element 9 of the first embodiment of the invention is that this connecting element 9 can now be embodied in a completely planar fashion since it can simultaneously also connect the small-area electrode 23 to a corresponding further lead 15.

FIG. 8 illustrates a schematic cross section through the power semiconductor device 30 in accordance with FIG. 5, the plastic housing composition 20 in this embodiment of the invention being arranged in such a way that a large-area electrode S is freely accessible on the top side 29 of the power semiconductor device 30 and a terminal source lead S is simultaneously provided on the underside 21 of the power semiconductor device 30 by means of the internal lead 10. The external drain contact D, by contrast, makes contact with a large-area electrode 5 on the rear side 6 of the power semiconductor chip 2 by means of the terminal drain contact D simultaneously forming a lead frame chip island 7 of the original lead frame 8, on which the power semiconductor chip 2 is fixed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device in lead frame technology with a vertical current path through a power semiconductor chip, the power semiconductor chip comprising:
   at least one large-area electrode on its top side; and
   a large-area electrode on its rear side;
   wherein the vertical current path is formed between the rear side electrode and the top side electrode;
   wherein the rear side electrode is surface-mounted on a lead frame chip island of a lead frame;

wherein the top side electrode is electrically connected to at least one internal lead of the lead frame via a connecting element;

wherein the connecting element comprises a first material and has an electrically conductive film comprising a second material disposed on a surface facing the top side electrode, wherein the electrically conductive film has a higher current conductivity than the connecting element, wherein the electrically conductive film comprises a plastic film filled with silver particles; and wherein the surface of the connecting element facing the top side electrode also faces the at least one internal lead, and wherein the electrically conductive film extends along the surface of the connecting element facing the top side electrode from the top side electrode to the at least one internal lead.

2. The power semiconductor device of claim 1, wherein the plastic film filled with silver particles has a degree of filler f being 92% by volume $\leq f \leq 98\%$ by volume.

3. The power semiconductor device of claim 1, wherein the electrically conductive film has an areal structure adapted to the areal structure of the internal lead and the areal structure of the top side electrode.

4. The power semiconductor device of claim 1, wherein an electrically conductive joining layer is arranged between the top side electrode and the electrically conductive film.

5. The power semiconductor device of claim 1, wherein a layer of a conductive adhesive is arranged between the top side electrode and the electrically conductive film.

6. The power semiconductor device of claim 1, wherein the power semiconductor chip has a control electrode on its top side, said control electrode being electrically connected to a further internal lead via a bonding wire.

7. The power semiconductor device of claim 1, wherein the power semiconductor chip has a control electrode on its top side, said control electrode being connected to a further internal lead via a patterned electrically conductive film of the connecting element, the film being patterned in such a way that a film strip that is electrically insulated from the connecting element is adapted to the control electrode and the further internal lead in terms of width and areal extent.

8. The power semiconductor device of claim 1, wherein the connecting element comprises a metal plate.

9. The power semiconductor device of claim 1, wherein the connecting element comprises an iron-chromium-nickel alloy.

10. The power semiconductor device of claim 1, wherein the electrically conductive film is joined to the top side electrode and to the at least one internal lead by a diffusion solder layer.

11. The power semiconductor device of claim 1, wherein the at least one internal lead is laterally offset and spaced apart from the power semiconductor chip so as to form a gap there between filled with a plastic housing composition in which the power semiconductor chip, at least one internal lead, and connecting element are embedded, and wherein the connecting element bridges gap between the power semiconductor chip and at least one internal lead.

12. The power semiconductor device of claim 1, wherein a surface of the at least one internal lead to which the electrically conductive film of the connecting element is connected faces away from the chip island and is substantially coplanar with a surface of the top side electrode to which the electrically conductive film is connected.

13. A power semiconductor device comprising:
a power semiconductor chip with a large-area top-side electrode on its top side and a large-area rear-side electrode on its rear side;
a vertical current path through the power semiconductor chip between the rear-side electrode and the top-side electrode;
a lead frame chip island of a lead frame on which the rear-side electrode is surface mounted, the lead frame further including at least one internal lead which is coplanar with and spaced from the lead frame chip island so as to form a gap therebetween; and
a connecting element which bridges the gap and electrically connects the at least one internal lead of the lead frame to the top-side electrode, the connecting element comprising a sheet of a first material and having a first side facing the top-side electrode and the at least one internal lead and including an electrically conductive film comprising a second material disposed on the first side and extending from the top side electrode to the internal lead, wherein the electrically conductive film has a electrical conductivity greater than that of the connecting element, and wherein the electrically conductive film comprises a plastic film filled with silver particles.

14. The power semiconductor device of claim 13, wherein the plastic film filled with silver particles has a degree of filler f being 92% by volume $\leq f \leq 98\%$ by volume.

15. The power semiconductor device of claim 13, wherein the electrically conductive film has an areal structure adapted to the areal structure of the internal lead and the areal structure of the top side electrode.

16. The power semiconductor device of claim 13, wherein an electrically conductive joining layer is arranged between the top side electrode and the electrically conductive film.

17. The power semiconductor device of claim 13, wherein a layer of a conductive adhesive is arranged between the top side electrode and the electrically conductive film.

18. The power semiconductor device of claim 13, wherein the power semiconductor chip has a control electrode on its top side, said control electrode being electrically connected to a further internal lead via a bonding wire.

19. The power semiconductor device of claim 13, wherein the lead frame includes a plurality of internal leads, each internal lead separate from one another and separate from and spaced from the lead frame chip island, and wherein the connecting element comprises a first portion which corresponds to the top side electrode and a plurality of finger-like projections extending from the first portion, each finger-like projection corresponding to one of the internal lead of the plurality of internal leads.

20. The power semiconductor device of claim 13, wherein the semiconductor includes an additional top side electrode, wherein the electrically conductive film includes a first conductive portion and a second conductive portion which are separated from one another by an insulating portion, and wherein the first conductive portion extends between the top side electrode and at least a first internal lead and the second conductive portion extends between the additional top side electrode and a second internal lead.

* * * * *